United States Patent [19]
Haselwood et al.

[11] 3,973,206
[45] Aug. 3, 1976

[54] MONITORING SYSTEM FOR VOLTAGE TUNABLE RECEIVERS AND CONVERTERS UTILIZING AN ANALOG FUNCTION GENERATOR

[75] Inventors: Donald E. Haselwood, Clearwater; Carl M. Solar, Largo; Jeffrey R. Thumm, Clearwater, all of Fla.

[73] Assignee: A. C. Nielsen Company, Northbrook, Ill.

[22] Filed: May 22, 1975

[21] Appl. No.: 580,055

[52] U.S. Cl.................... 325/455; 178/DIG. 13; 324/78 D; 325/31
[51] Int. Cl.² ............................................ H04B 1/16
[58] Field of Search ............. 325/31, 53, 308, 455; 178/DIG. 13; 179/2 AS; 334/86, 87; 324/78 D, 78 J, 79 D

[56] References Cited
UNITED STATES PATENTS

| | | | |
|---|---|---|---|
| 3,058,065 | 10/1962 | Freeman et al. | 325/31 |
| 3,509,484 | 4/1970 | Basse | 324/78 D |
| 3,701,951 | 10/1972 | Krausser | 325/455 |
| 3,818,351 | 6/1974 | Terui | 325/455 |
| 3,835,424 | 9/1974 | Marik | 325/455 |
| 3,906,450 | 9/1975 | da Silva Prado, Jr. | 178/DIG. 13 |

Primary Examiner—Robert L. Griffin
Assistant Examiner—Marc E. Bookbinder
Attorney, Agent, or Firm—Mason, Kolehmainen, Rathburn & Wyss

[57] ABSTRACT

A system for monitoring the channel to which a remotely located voltage tunable receiver or converter is tuned includes a comparator for comparing the magnitude of the tuning voltage with an internally generated reference voltage to determine the channel number. The reference voltage is generated by a counter driving a linear digital-to-analog converter. The output of the digital-to-analog converter is modified with an analog function generator to provide a piecewise linear approximation of the receiver tuning voltage versus channel number characteristic. A window comparator is utilized to compare the output of the function generator with the tuning voltage and to stop the counter and transfer the contents of the counter to an output circuit when the magnitude of the reference voltage approaches that of the tuning voltage. The contents of the counter at the time the counter is interrupted is indicative of the channel number of the station being received.

13 Claims, 7 Drawing Figures

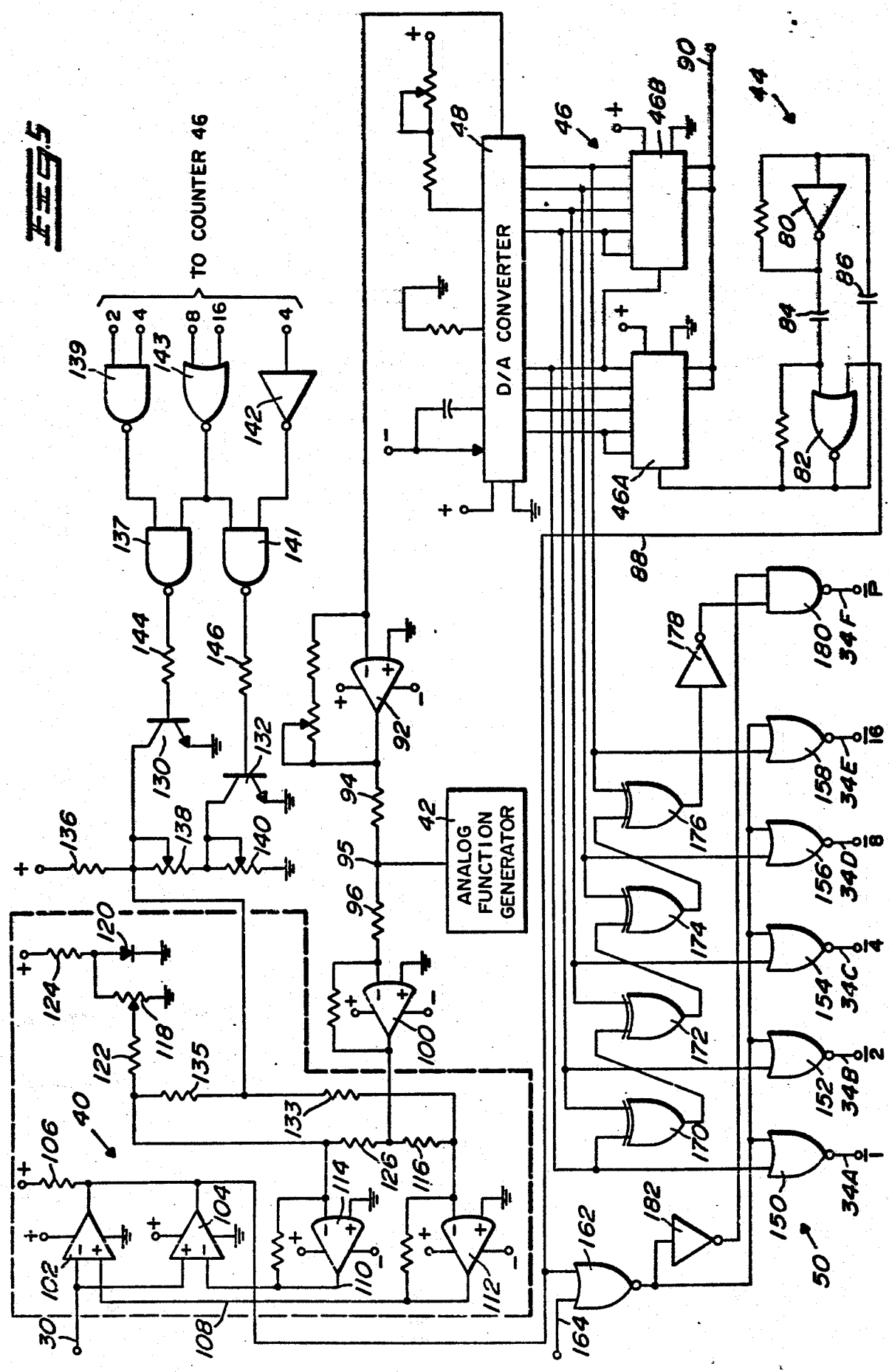

MONITORING SYSTEM FOR VOLTAGE TUNABLE RECEIVERS AND CONVERTERS UTILIZING AN ANALOG FUNCTION GENERATOR

BACKGROUND OF THE INVENTION

This invention relates generally to remote monitoring systems, and more particularly, to systems for remotely determining the number of the channel to which a remotely located voltage tunable receiver or CATV converter has been tuned.

With the advent of voltage tunable television receivers and CATV converters, it is possible to determine the number of the channel being received by the receiver or converter by monitoring the tuning voltage applied to the receiver or converter; however, the nonlinear relationship between the tuning voltage and the channel number as well as the wide variation in tuning voltage necessary to tune different receivers to the same channel has heretofore precluded the use of the tuning voltage as an indication of the number of the channel to which the receiver is tuned.

SUMMARY OF THE INVENTION

Accordingly, an object of the present invention is to provide a new and improved remote monitoring system for monitoring the channel to which a voltage tunable receiver or converter is tuned.

In accordance with a preferred embodiment of the present invention, the tuning voltage from a CATV converter or a television receiver is applied to an encoder that generates a binary signal representative of the number of the channel to which the converter or receiver is tuned in response to the amplitude of the tuning voltage. The encoder utilizes a window comparator to compare the amplitude of the tuning voltage with the amplitude of an internally generated reference voltage. The internally generated reference voltage is generated by an 8-bit counter that counts the pulses from a clock and drives a digital-to-analog converter. The digital-to-analog converter generates a linear staircase waveform having substantially equal increments between steps in response to the increasing count in the counter. Since the tuning voltage versus channel number characteristic of most receivers and converters is generally a nonlinear function and since the output of the digital-to-analog converter is generally a linear function, an analog function generator is utilized to modify the output of the digital-to-analog converter prior to comparison with the tuning voltage. A window comparator compares the amplitude of the tuning voltage with the amplitude of the output signal from the analog function generator and generates a signal to stop the clock and to transfer the contents of the counter to an output circuit when the amplitude of the signal from the analog function generator approaches the amplitude of the tuning voltage. The contents of the counter are indicative of the channel number being received.

The analog function generator includes a voltage divider network and a plurality of switching devices for altering the division ratio of the voltage divider as a function of the magnitude of the voltage from the digital-to-analog converter. The number of switching circuits necessary is determined by the shape of the tuning voltage versus channel number curve and is selected to provide a piecewise linear approximation of the tuning voltage curve. An offset biasing circuit may also be used in conjunction with the analog function generator to adjust the output of the function generator to compensate for discontinuities (such as those arising from band switching) in the tuning voltage.

BRIEF DESCRIPTION OF THE DRAWING

The above and other objects and advantages and novel features of the present invention will become apparent from the following detailed description of a preferred embodiment of the invention illustrated in the accompanying drawing wherein:

FIG. 5 is a detailed block and schematic diagram of a preferred embodiment of the system of FIG. 1.

DESCRIPTION OF THE PREFERRED EMBODIMENT

Figure 1:
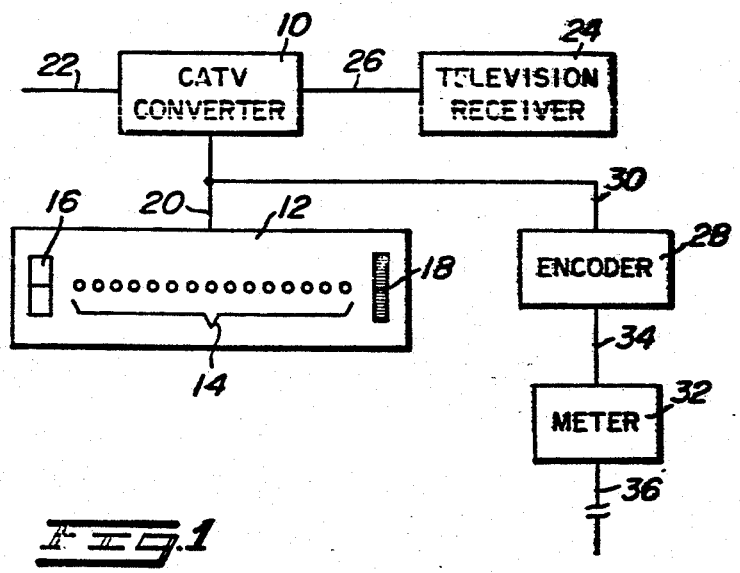
FIG. 1 is a generalized block diagram of the channel number monitoring system connected to a CATV television system and constructed in accordance with the principles of the present invention.

Referring now to the drawing, and particularly to FIG. 1, there is illustrated a CATV (community antenna television) converter 10 having a frequency of operation that is controlled by a direct current tuning voltage supplied to the converter 10 from a control panel 12. The control panel 12 contains, in this embodiment, 15 push-button switches 14 and a band switch 16 that switches the push-button switches 14 from a high band to a low band to permit 30 channels to be selected by the control panel 12. A thumb wheel adjustment 18 provides fine tuning of each of the selected channels.

The control panel 12 contains a plurality of resistive dividers (not shown). The voltage division ratio of the resistive dividers is controlled by the push buttons 14, the band switch 16 and the fine tuning adjustment 18 which cooperate to provide a variable tuning voltage to the converter 10 via conductor 20. The variable voltage applied to the converter 10 from the conductor 20 is applied to one or more voltage variable capacitance diodes (not shown) which adjust the tuning of the converter 10 to cause the converter 10 to convert the frequency of signals received from the community antenna via a cable 22 to a fixed frequency to which a television receiver 24 is tuned. The converter 10 and the control panel 12 may comprise, for example, a Model RSC-2 or a Model RSC-3 converter manufactured by Jerrold Electronics. Such converters convert the CATV signal received by the cable 22 to a signal having a frequency corresponding to channel 2 or channel 3, depending upon the converter model. The television receiver 24 is then tuned to the appropriate channel and receives the converted signal via a cable 26.

The tuning voltage present on the line 20 is also applied to an encoder 28 via a line 30. The encoder 28 is responsive to the voltage appearing at the line 30 to generate a digital code signal representative of that voltage. If required, the digital code signal may be applied to a meter 32 (via a line 34) that converts the signal from the encoder 28 to a signal compatible with a standad telephone line and applies the converted signal to a telephone line 36.

Figure 1A:
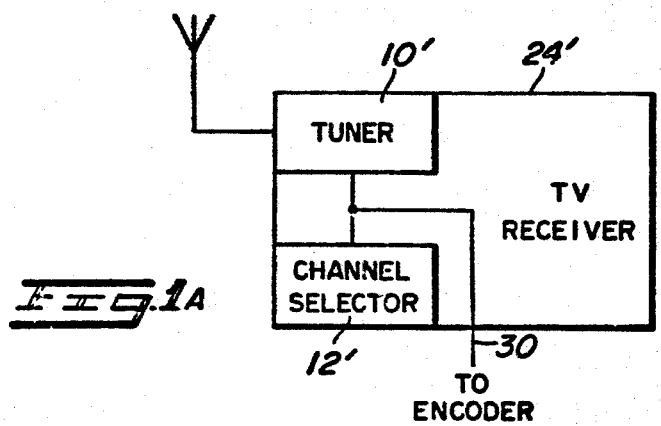
FIG. 1A is a block diagram of a voltage tunable television receiver as used in conjunction with the system of FIG. 1.

If a television receiver 24' (FIG. 1A) having a voltage variable tuner 10' and a channel selector 12' that applies a variable tuning voltage to the tuner 10' is employed, the line 30 may be connected directly to the output of the channel selector 12' to determine the number of the channel to which the television receiver 24' is tuned. The monitoring system according to the invention is usable with any voltage tuned receiver or converter, and for purposes of the following discussion, the term receiver shall be defined to include both voltage tunable receivers 24' (FIG. 1A) and conventional receivers 24 (FIG. 1) utilizing a voltage tunable converter 10.

Figure 2:
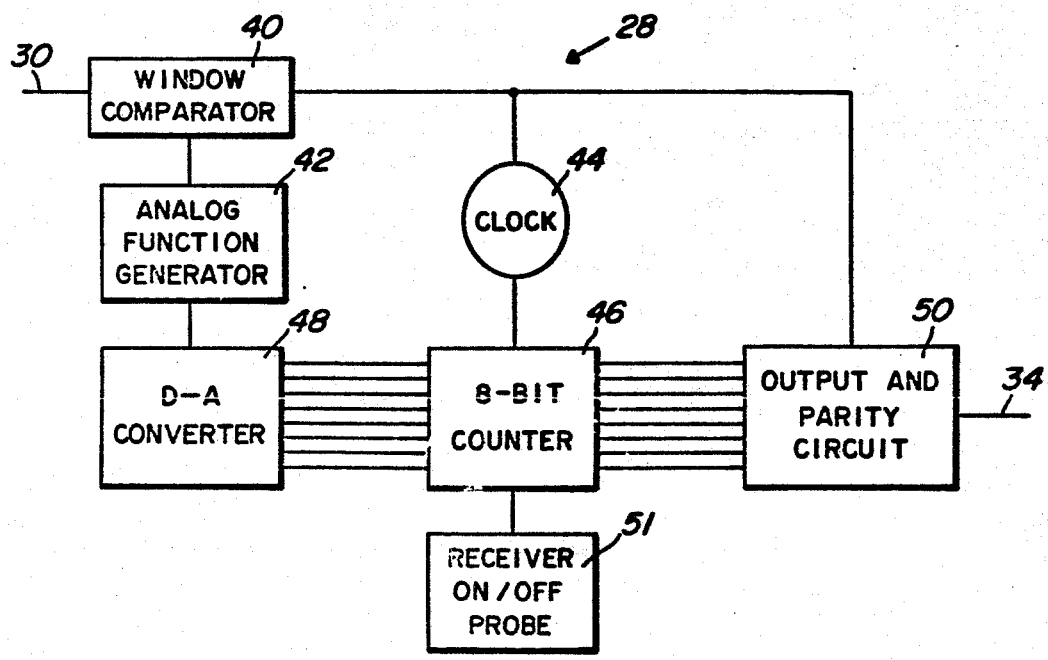
FIG. 2 is a block diagram of a preferred embodiment of an encoder as used with the system of FIG. 1.

Since the voltage applied to the line 30 is not linearly related to the number of the channel to which a receiver is tuned, the encoder 28 (FIG. 2) is provided for deriving the number of the channel being received from the nonlinear voltage versus channel number relationship. The encoder 28 utilizes a window comparator 40 for comparing the magnitude of the voltage applied to the line 30 with the output of an analog function generator 42. The output of the window comparator 40 controls the operation of a clock 44 that drives an 8-bit counter 46. The counter 46 generates an 8-bit binary number representative of the number of clock pulses received and applies the binary number to a digital-to-analog converter 48. The digital-to-analog converter 48 provides an output voltage having an amplitude directly proportional to the binary number received. Consequently, as the clock continues to run, the binary number is increased; and the output of the digital-to-analog converter is incrementally increased in response thereto to generate a staircase waveform having substantially equal increments between steps.

The linearly incremented staircase waveform from the digital-to-analog converter 48 is converted to a piecewise linear function approximating the voltage versus channel number characteristic of the tuning voltage appearing at the line 30 by the analog function generator 42 and applied to the window comparator 40. The window comparator 40 compares the voltage present on the line 30 with the output of the analog function generator 42.

Initially, the output of the analog function generator 42 is lower than the voltage on the line 30; and the window comparator 40 generates an output signal to maintain the clock 44 operative. As the clock 44 continues to run, the count in the 8-bit counter is increased, the output of the analog function generator gradually increases until the magnitude of the analog signal from the function generator 42 reaches a value arbitrarily close (within the window defined by the window comparator 40) to the amplitude of the tuning voltage applied to the line 30. At this point, the window comparator 40 generates a signal to terminate the operation of the clock 44 and to freeze the count in the counter 46. Simultaneously, the window comparator 40 applies a signal to an output and parity circuit 50 which transfers the contents of the counter 46 to an output line 34. The output and parity circuit 50 also generates a parity bit to aid in checking the validity of the data applied to the line 34. The line 34 (FIGS. 1 and 2) is shown as a single line for purposes of clarity; however, if a parallel data output circuit is employed (FIG. 5), the number of output lines would be equal to the number of data bits defining the channel number plus the parity bit.

Finally, an on/off probe 51 is utilized to disable the 8-bit counter 46 when the receiver is turned off. Various conventional circuits may be used for the probe 51; and, in a preferred embodiment, the probe 51 includes a tuned circuit inductively coupled to the horizontal scanning circuit of the television receiver to provide an output signal indicative of the operation of the receiver when the scanning signal is present. To minimize false triggering of the probe 51, a relatively long turn-on time constant (approximately 4 seconds) is used along with a much shorter turn-off time constant. This requires the horizontal scanning signal to be present at least 4 seconds before an on indication is generated.

Figure 3:
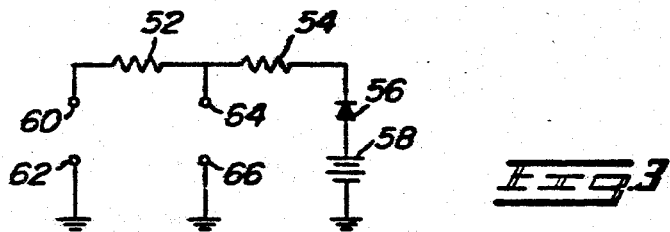
FIG. 3 is a schematic diagram of a simplified analog function generator.

A simple form of an analog function generator 42 (FIG. 3) includes a pair of resistors 52 and 54 connected in series with a diode 56 and a battery 58. The input voltage to the function generator is applied to a pair of input terminals 60 and 62 and the output voltage is obtained across a pair of output terminals 64 and 66. The diode 56 and the battery 58 are poled such that the diode 56 is conductive when the voltage applied to the input terminals 60 and 62 is less than the voltage of the battery 58. When the voltage applied to the terminals 60 and 62 exceeds the voltage of the battery 58, the diode 56 is reverse biased, thereby switching the resistor 54 out of the circuit and causing a change in the slope of the output voltage characteristic at the terminals 64 and 66.

Figure 4:
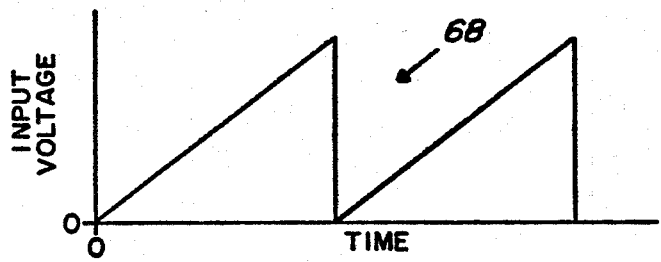
FIG. 4 is a graph showing a typical input waveform applied to the analog function generator of FIG. 3 and the resultant output waveform.

For example, if a linearly increasing voltage such as the voltage illustrated in the upper waveform 68 (FIG. 4), is applied to the input terminals 60 and 62, the output voltage appearing across the terminals 64 and 66 will have a nonlinear region occurring at the point that the diode 56 is rendered nonconductive, as illustrated in the lower waveform 70 (FIG. 4). When the value of the input waveform 68 is equal to zero volts, the output voltage as represented by the waveform 70 has a value equal to the voltage of the battery 58 multiplied by the ratio of the value of the resistor 52 divided by the sum of the values of the resistors 52 and 54. The output voltage corresponding to the zero input condition is represented by a line 72. As the input voltage is increased in a linear fashion, the output voltage increases linearly until the value of the input voltage is equal to the voltage of the battery 58 represented by a line 74. At this time, the diode 56 is rendered nonconductive and the value of the output voltage is substantially equal to the value of the input voltage for all input voltage levels in excess of the voltage of the battery 58. Thus, a change in slope of the output voltage waveform 70 results from the resistor 54 being switched out of the circuit by the diode 56 to enable the output voltage to follow the input voltage.

In accordance with a specific embodiment of the present invention, the clock 44 is formed by an inverter 80 and a NOR gate 82 (FIG. 5) interconnected by a pair of capacitors 84 and 86 to form an astable multivibrator. The output of the window comparator 54 is connected to an input of the NOR gate 82. The window comparator 40 controls the operation of the clock 44 by applying a high logic voltage to the line 88 to terminate the operation of the clock 44 and a low logic voltage to permit the clock 44 to run.

The output pulses from the clock 44 are applied to the counter 46. In this embodiment, the 8-bit counter 46 is synthesized from two 4-bit counters 46A and 46B connected in cascade to form an 8-bit counter. The counters 46A and 46B are reset and enabled when the receiver is turned on by a signal from the receiver on/-off probe 51 applied to a reset line 90. Although other configurations are possible, type 7493 4-bit binary counters manufactured by Texas Instrument Corporation (and others) are used as the binary counters 46A and 46B.

The 8-bit signal from the binary counter 46 is applied to the digital-to-analog converter 48 which may be a standard MC1408L-8 digital-to-analog converter manufactured by Motorola Incorporated. The output signal of the digital-to-analog converter 48 is inverted by an inverting amplifier 92 and applied to the analog function generator 42 via a resistor 94. The modified analog signal appearing at a junction 95 of the resistor 94 and the analog function generator 42 is applied through a resistor 96, an inverting amplifier 100 which inverts the modified signal and applies it to the window comparator 40.

The window comparator 40 includes a pair of comparators 102 and 104. The outputs of the comparators 102 and 104 are connected together and coupled to a positive voltage source through a resistor 106. The inverting input of the comparator 102 is connected to the line 30 and to the noninverting input of the comparator 104.

The voltages defining the window are determined as follows. When the magnitude of the voltage present at the line 30 is less than the magnitude of the voltage applied to the noninverting input of the comparator 102 via a line 108, the output of the comparator 102 is a high logic voltage. When the amplitude of the voltage present on the line 30 exceeds the amplitude of the voltage on the line 108, the output of the comparator 102 is a low logic voltage. The input connections to the comparator 104 are reversed to that the output of the comparator 104 is a low logic voltage when the amplitude of the voltage at the line 30 is below the reference voltage applied to the inverting input of the comparator 104 via a line 110. Increasing the amplitude of the voltage on the line 30 above the amplitude of the voltage at the line 110 permits the output of the comparator 104 to be a high logic voltage. Since the outputs of the comparators 102 and 104 are connected to a common load resistor 106, in order to have a high output at the junction of the resistor 106 and the outputs of the amplifiers 102 and 104, both of the comparators 102 and 104 must generate a high output logic voltage. If the output of either of the comparators 102 and 104 goes low, the output of the other comparator will be forced low, thereby resulting in a low output. Hence, a high output will result only when the outputs of both of the comparators 102 and 104 are high. This occurs only when the amplitude of the voltage present on the line 30 is greater than the amplitude of the voltage on the line 110 and less than the amplitude of the voltage present on the line 108.

The voltages on the lines 108 and 110 are determined by the output voltages of a pair of amplifiers 112 and 114. The amplifier 112 is connected to the output of the amplifier 100 by a resistor 116 and provides an output signal having a magnitude proportional to the voltage at the junction 95 of the function generator 42 and the resistor 94. The amplifier 114 is connected to the output of the amplifier 100 by a voltage offsetting network including a potentiometer 118, a diode 120 and resistors 122, 124 and 126. The offsetting network defines the window by offsetting the voltage applied to the amplifier 114 by an amount proportional to the relative values of the resistors 122 and 126 and the setting of the potentiometer 118. This results in a voltage being applied to the line 110 having a magnitude proportional to the modified analog voltage at the junction 95 and the offsetting voltage provided by the offsetting network.

The magnitude of the window may be selected empirically or may be calculated. The factors to be considered when calculating the size of the window include the expected deviation of the piecewise linear approximation provided by the function generator 42 from the true voltage versus channel number curve and the accuracy of channel number determination desired. Typically, the window should be made large enough to accept the deviation of the piecewise linear approximation from the true tuning voltage curve without sacrificing the 8-bit accuracy provided by the 8-bit counter 46 and the digital-to-analog converter 48.

In a practical CATV converter such as the Jerrold converter described previously, discontinuities occur in the voltage versus channel number characteristic. Consequently, a bias shifting circuit must be provided to shift the output of the analog function generator or the window of the window comparator 40. The bias shifting is accomplished by a pair of bias shifting transistors 130 and 132 which control a bias shifting network including resistors 133, 135 and 136 and a pair of potentiometers 138 and 140. The transistors 130 and 132 are controlled by logic circuitry including gates 137, 139, 141 and 143 and an inverter 142. The logic circuitry serves to render one of the transistors 130 and 132 conductive to shift the analog voltage level where necessary at channels 2 and 6. The potentiometers 138 and 140 serve to adjust the amount of shift.

In operation, the inputs of the inverter 142 and gates 139 and 143 are connected to the two, four, eight and 16 count outputs of the counter 46. When the converter is tuned to a station having a channel number greater than or equal to eight, one of the eight or 16 inputs to the gate 143 is high, thereby resulting in a low signal being applied to the NAND gates 137 and 141. This results in a high output from both of the gates 137 and 141 which is applied to the transistors 130 and 132 through a pair of resistors 144 and 146, respectively, to maintain the transistors 130 and 132 conductive whenever a station having a channel number higher than eight is selected. When the station selected has a channel number of seven or less, the gate 143 generates a high level signal to enable the gates 137 and 141. If the selected channel number is further reduced to a number below channel six, the gate 139 provides a high output to the gate 137 which, in turn, provides a low output to render the transistor 130 nonconductive to shift the voltage at the junction of the resistors 133 and 135 and consequently the voltage applied to the inputs of the amplifiers 112 and 114. If the selected station has a channel number lower than four, the inverter 142 provides a high output to the gate 141 to render the transistor 132 nonconductive, thereby further shifting the voltage applied to the amplifiers 112 and 114.

The output portion of the output and parity circuit 50 includes five NOR gates 150, 152, 154, 156 and 158 each having an input connected to one of the five most significant digit outputs of the counter 46. The other input of each of the gates 150, 152, 154, 156 and 158 is connected to the output of an enabling NOR gate 162. One of the inputs of the enabling NOR gate 162 is connected to the output of the window comparator 40 and the other input 164 is connected to the output of the receiver on/off probe 51. Consequently, the output from the counter 146 is passed through the output gates 150, 152, 154, 156 and 158 only when the set is in operation and the window comparator 40 provides a high level output indicating that the internally generated analog signal has an amplitude close to the amplitude of the tuning voltage present on the line 30. Since NOR gates, which act as inverters when enabled, are used, the polarity of the data in the counter 46 is reversed, and the output of the output and parity circuit 50 is in negative logic.

A parity circuit including exclusive-OR gates 170, 172, 174 and 176, an inverter 178 and a NAND gate 180 is employed to generate a parity bit whenever the number of ones or high logic signals applied to the output and parity circuit 50 is odd. Such a parity circuit is conventional and is used to check the validity of the output data. As with the gates 150, 152, 154, 156 and 158, the NAND gate 180 is enabled by an inverter 182 connected to the gate 162 only when the set is in operation and the clock 44 has stopped.

Figure 6:
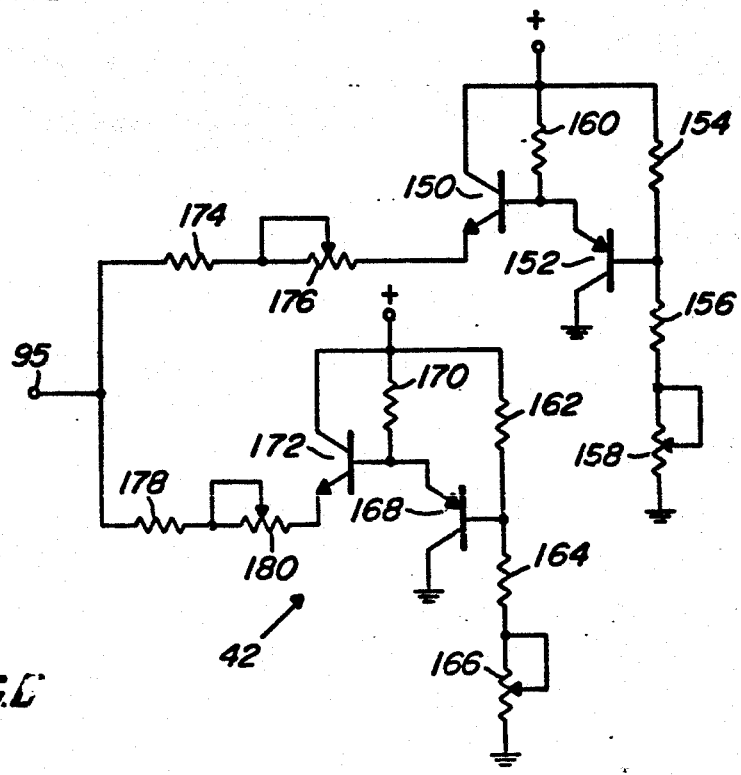
FIG. 6 is a detailed schematic diagram of a specific analog function generator as used with the system of FIGS. 1 and 5.

In order to approximate the tuning voltage versus channel number characteristic of the receiver with sufficient precision, the piecewise linear approximation requires at least two break points defining three slopes. In order to generate the two break points, two switching circuits are utilized in the analog function generator 42. The first switching circuit includes a pair of complementary symmetry transistors 150 and 152 (FIG. 6). The base of the transistor 152 is biased by a biasing network comprising a pair of resistors 154 and 156 and a potentiometer 158. The biasing network provides an adjustable reference voltage to the base of the transistor 152. This reference voltage is offset by one diode drop and appears across a resistor 160 to provide a reference voltage for the transistor 150. The voltage across the resistor 160 is offset by one diode drop in the opposite direction to provide a voltage at the emitter of the transistor 150 substantially equal to the voltage applied to the base of the transistor 152. Since the transistors 150 and 152 have complementary symmetry, the base-to-emitter offset voltage is cancelled and temperature changes do not substantially affect the break point voltages.

In a similar fashion, a bias network including a pair of resistors 162 and 164 and a potentiometer 166 generates a reference voltage for a transistor 168. The output at the emitter of the transistor 168 is applied to a resistor 170 and the base of a second transistor 172. The transistors 168 and 172 also have complementary symmetry so that the output voltage at the emitter of the transistor 172 is substantially equal to the voltage applied to the base of the transistor 168.

The emitter of the transistor 150 is connected to the junction point 95 by a resistor 174 and a potentiometer 176 connected in series. Similarly, the emitter of the transistor 172 is connected to the junction point 95 by a series combination of a resistor 178 and a potentiometer 180. The transistors 150 and 172 are selectively rendered conductive in response to the voltage present at the junction point 95. For example, if the output voltage at the junction 95 is higher than the voltage at the bases of the transistors 152 and 168, the emitter-to-base junctions of the transistors 150 and 172 are reverse biased, thereby rendering the transistors 150 and 172 nonconductive. Under these conditions, the circuit 42 has no effect on the output voltage from the amplifier 92 (FIG. 5). As the voltage present at the junction 95 gradually decreases to a level below the voltage applied to the base of the transistor 168, the transistor 172 is rendered conductive to switch the resistor 178 and the potentiometer 180 in circuit with the junction point 95 to modify the voltage at that point. This causes a decrease in the slope of the analog changing voltage at the junction 95, the slope being adjustable by the potentiometer 180. Similarly, as the voltage at the junction point 95 decreases further to a level below the voltage applied to the base of the transistor 152, the transistor 150 is rendered conductive further to change the slope of the voltage curve in accordance with the setting of the potentiometer 176.

Obviously, many modifications and variations of the present invention are possible in light of the above teachings. Thus, it is to be understood that, within the scope of the appended claims, the invention may be practiced otherwise than as specifically described.

What is claimed and desired to be secured by Letters Patent of the United States is:

1. Apparatus for determining the channel of a plurality of channels to which a voltage tunable receiver is tuned comprising
    means for generating a counting sequence, each count of said counting sequence being representative of one of said plurality of channels,
    means responsive to said counting sequence for providing a first signal having an amplitude linearly related to said counting sequence,
    means responsive to the amplitude of said first signal for providing a second signal having an amplitude nonlinearly related to said counting sequence and
    means responsive to said second signal and the tuning voltage of said receiver for suspending the counting sequence when the amplitude of said second signal has a predetermined relationship to the amplitude of said tuning voltage.

2. Apparatus as recited in claim 1 wherein said second signal providing means includes means responsive to the amplitude of said first signal for altering the relative amplitudes of said first and second signals.

3. Apparatus as recited in claim 2 wherein said altering means includes means for varying the amplitude transfer function of said second signal providing means.

4. Apparatus as recited in claim 1 wherein the amplitude of said tuning voltage is related to the channel to which said receiver is tuned in a nonlinear relationship and wherein said second signal providing means comprises means for providing a piecewise linear approximation of said nonlinear relationship.

5. Apparatus as recited in claim 4 wherein said piecewise linear approximation providing means includes a voltage divider circuit having a plurality of division ratios and means for altering the division ratio of said voltage divider circuit.

6. Apparatus as recited in claim 1 wherein said counting sequence generating means includes a timing signal producing clock and a counter connected to said clock and responsive to said timing signals for providing a digital signal representative of the number of timing signals received thereby.

7. Apparatus as recited in claim 6 wherein said counting sequence responsive means includes a digital-to-analog converter responsive to said digital signal for providing an analog signal having an amplitude proportional to the value of said digital signal.

8. Apparatus as recited in claim 6 wherein said counting sequence suspending means includes a window comparator.

9. Apparatus as recited in claim 8 wherein said window comparator is operatively coupled to said clock for suspending the production of timing signals when the amplitude of said second signal is within a predetermined amplitude range about said tuning voltage.

10. A method for determining the channel of a plurality of channels to which a voltage tunable receiver is tuned comprising the steps of
generating a first variable signal having a characteristic linearly related to the sequence of channels to which the receiver may be tuned,
modifying said first signal to provide a second variable signal having a predetermined characteristic that is nonlinearly related to said sequence of channels,
comparing said predetermined characteristic of said second signal with said tuning voltage and
determining the channel corresponding to said second signal when the predetermined characteristic of said second signal has a predetermined relationship to said tuning voltage.

11. A method as recited in claim 10 wherein the step of generating said first signal includes the steps of
generating a plurality of timing signals,
counting said timing signals to provide a variable count signal, each count value of the variable count signal being representative of one of said plurality of channels and
generating an analog signal linearly related to said variable count signal to provide said first variable signal.

12. A method as recited in claim 11 wherein the step of determining said channel includes the step of determining the value of said variable count signal when the predetermined characteristic of said second signal has said predetermined relationship to said tuning voltage.

13. A method as recited in claim 12 wherein said predetermined characteristic of said second signal is the amplitude of the voltage thereof and wherein the step of comparing the predetermined characteristic of said second signal with said tuning voltage includes the step of comparing the amplitude of the voltage of said second signal with the amplitude of said tuning voltage.

* * * * *